US006297085B1

(12) United States Patent
Aoki et al.

(10) Patent No.: US 6,297,085 B1
(45) Date of Patent: Oct. 2, 2001

(54) METHOD FOR MANUFACTURING FERROELECTRIC CAPACITOR AND METHOD FOR MANUFACTURING FERROELECTRIC MEMORY

(75) Inventors: Katsuhiro Aoki, Tsuchiura; Yukio Fukuda, Naka-gun, both of (JP); Ikuko Murayama, Richardson; Ken Numata, Dallas, both of TX (US); Akitoshi Nishimura, Tsuchiura (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/988,687

(22) Filed: Dec. 11, 1997

(51) Int. Cl.$^7$ ............................................... H01L 21/8242
(52) U.S. Cl. .............................. 438/240; 438/3; 438/396
(58) Field of Search .............................. 438/3, 396, 104, 438/239, 240, 250, 393, 785, 778, 930, FOR 430, FOR 271, FOR 395

(56) References Cited

U.S. PATENT DOCUMENTS

| | | | | |
|---|---|---|---|---|
| 5,191,510 | * | 3/1993 | Huffman | 361/313 |
| 5,527,567 | * | 6/1996 | Desu et al. | 427/58 |
| 5,566,045 | * | 10/1996 | Summerfelt et al. | 438/253 |
| 5,589,284 | * | 12/1996 | Summerfelt et al. | 428/701 |
| 5,622,567 | * | 4/1997 | Kojima et al. | 118/726 |
| 5,626,906 | * | 5/1997 | Summerfelt et al. | 427/79 |
| 5,674,563 | * | 10/1997 | Tarui et al. | 427/250 |
| 5,719,417 | * | 2/1998 | Roeder et al. | 257/751 |

FOREIGN PATENT DOCUMENTS 7-99252 * 4/1995 (JP) .

* cited by examiner

Primary Examiner—Carl Whitehead, Jr.
Assistant Examiner—Jeff Vockrodt
(74) Attorney, Agent, or Firm—William B. Kempler; Frederick J. Telecky, Jr.

(57) ABSTRACT

To provide a method that can be used to form a high-quaility ferroelectric film by forming good nuclei when using the sputtering method to manufacture a PZT capacitor or other forroelectric capacitors using Ir or other electrode substances in addition to Pt for the electrode. In the method for manufacturing a PZT ferroelectric capacitor CAP, after titanium film 31 is deposited on Ir electrode 6, lead oxide 32 is deposited at a substrate temperature higher than the crystallization temperature of lead titanate using the sputtering method. Lead zirconate titanate 34 is then deposited at a substrate temperature higher than the aforementioned substrate temperature using the sputtering temperature. Afterwards, a heat treatment of the deposited film is performed to produce PZT film 17.

3 Claims, 8 Drawing Sheets

METHOD FOR MANUFACTURING FERROELECTRIC CAPACITOR AND METHOD FOR MANUFACTURING FERROELECTRIC MEMORY

FIELD OF THE INVENTION

This invention pertains to a method for manufacturing a ferroelectric capacitor (particularly, the capacitor of a semiconductor memory cell having a lead zirconate titanate (PZT) film) and a method for manufacturing a ferroelectric memory device.

BACKGROUND OF THE INVENTION

For example, an ONO film formed by sequentially laminating SiO2, Si3N4, and SiO2 is used as an insulating film (dielectric film) for forming the capacitor of a dynamic RAM memory cell.

However, since the effective specific inductive capacity of the ONO film is as low as about 5, under the area restriction, a complicated shape is required to make the capacitor's dielectric film thinner and to expand the area when the film is used for a memory with a capacity of 256 Mb or larger. As a result, the process becomes very complicated.

On the other hand, the ferroelectric material with a perovskite crystal structure becomes noticeable as a material to be used in the future to form the insulating film of the capacitor for dynamic RAM because it has a very high specific inductive capacity ranging from a level of several hundred to several thousand.

The sol-gel method, CVD (chemical vapor deposition) method, sputtering method, etc., can be used to form the PZT film represented by Pb(Zr, Ti)O3 in the ferroelectric material. Among these methods, the sputtering method is the most appropriate one for mass production because it can uniformly form a film on an extensive flat portion without being affected by the roughness of the substrate.

However, when the PZT film is formed using the sputtering method, the density of the formed PZT crystallized nuclei on the substrate is low, and PbO evaporates in the formed film because of the low crystallinity. Consequently, it is relatively difficult to obtain a PZT capacitor with good electrical characteristics.

Platinum (Pt) is ordinarily used as the electrode substance for the PZT capacitor. However, since Pt is unable to reduce the silicon oxidized film, it cannot be directly adhered to the film. Therefore, after a Ti bonding layer with a thickness of about 50 nm is formed on the silicon oxidized film, Pt is deposited using the sputtering method or the electron beam heating deposition method.

When the PZT film is formed on said Pt using the sol-gel method, Ti diffuses through the Pt grain boundary to form TiO2 at the Pt-PZT boundary. Said TiO2 acts as the crystal nucleus when the PZT film is formed. In the sputtering method, however, since the evaporation of PbO is severe, it is difficult to form a PZT film better than that formed using the sol-gel method.

On the other hand, it is known that an electrode made of an oxidizing metal, such as iridium (Ir), or an electroconductive oxide, such as iridium oxide (IrO2), can be used to improve the polarization fatigue characteristics property of the PZT capacitor. However, when these substances are present on the substrate, the effect of forming nuclei by means of Ti diffusion cannot be realized even when a Ti layer is formed.

The purpose of this invention is to provide a method that can be used to form a high-quality ferroelectric film by forming good nuclei when using the sputtering method to manufacture a PZT capacitor or other ferroelectric capacitors using Ir or other electrode substances in addition to Pt for the electrode.

SUMMARY OF THE INVENTION

This invention provides a method for manufacturing a ferroelectric capacitor characterized by the following facts: this method is used to manufacture a ferroelectric capacitor comprising a first electrode made of iridium, etc., a ferroelectric film made of lead zirconate titanate, etc., and formed on the first electrode, and a second electrode made of iridium, etc., and formed on the ferroelectric film; this manufacturing method has the following steps:

a step in which at least one type of constitutive metal element (such as titanium) of the aforementioned ferroelectric film or its oxide is deposited on the aforementioned first electrode to form a metal or metal oxide film (such as a titanium film);

a step in which the oxide of a metal element (such as the oxide of lead: PbO), which is a type of constitutive metal element of the aforementioned ferroelectric film and is different from the aforementioned metal or metal oxide film, is deposited on the aforementioned metal or metal oxide film;

a step in which an oxide film (such as lead titanate: PbTiO3) consisting of the deposited metal oxide (such as lead oxide) and the metal (such as titanium) of the aforementioned metal or metal oxide film, is generated on the aforementioned first electrode;

a step in which the generated oxide film is used as the crystal nucleus, and in which the constitutive material (such as lead zirconate titanate: Pb(Ti, Zr)O3) of the aforementioned ferroelectric film is deposited on the oxide film to form the aforementioned ferroelectric film; and a step in which the aforementioned second electrode is formed on the ferroelectric film. This invention also provides a method for manufacturing a ferroelectric memory, characterized by the fact that it includes a step in which a ferroelectric capacitor is formed in a memory cell using the aforementioned manufacturing method.

BRIEF DESCRIPTION OF THE DRAWINGS

FIG. 1 is a brief cross-sectional view illustrating the process for forming the ferroelectric capacitor of this invention.

FIG. 2 is a brief cross-sectional view illustrating the continuation of the manufacturing process shown in FIG. 1.

FIG. 3 is a brief cross-sectional view illustrating a semiconductor device in which the ferroelectric capacitor of this invention is incorporated.

FIG. 4 is the X-ray diffraction spectrum diagram of the film at different substrate temperatures for forming the PZT film of the ferroelectric capacitor.

FIG. 5 is the I–V characteristics diagram of the PZT film formed on each electrode.

FIG. 6 is the hysteresis curve of the polarization value for the PZT of the ferroelectric capacitor of this invention.

FIG. 7 is a diagram illustrating the relationship between the remnant polarization density of the PZT capacitor and the number of polarizing inversions for various types of electrode materials.

FIG. 8 is an enlarged cross-sectional view illustrating a step of the method for manufacturing a dynamic RAM memory cell in which the ferroelectric capacitor of this invention is incorporated.

FIG. 9 is an enlarged diagram illustrating a step of the method for manufacturing the aforementioned memory cell.

FIG. 10 is an enlarged diagram illustrating a step of the method for manufacturing the aforementioned memory cell.

FIG. 11 is an enlarged diagram illustrating a step of the method for manufacturing the aforementioned memory cell.

FIG. 12 is an enlarged diagram illustrating a step of the method for manufacturing the aforementioned memory cell.

FIG. 13 is an enlarged diagram illustrating a step of the method for manufacturing the aforementioned memory cell.

FIG. 14 is an enlarged diagram illustrating a step of the method for manufacturing the aforementioned memory cell.

FIG. 15 is an enlarged diagram illustrating a step of the method for manufacturing the aforementioned memory cell.

FIG. 16 is an enlarged diagram illustrating a step of the method for manufacturing the aforementioned memory cell.

FIG. 17 is an enlarged diagram illustrating a step of the method for manufacturing the aforementioned memory cell.

Figure 1A:
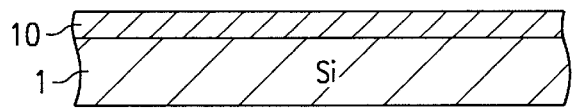
FIG.1
Figure 1B:
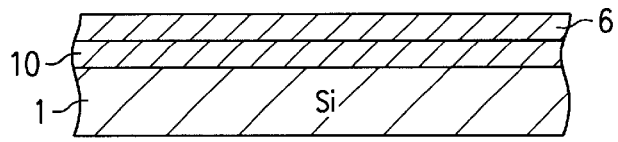
Figure 1C:
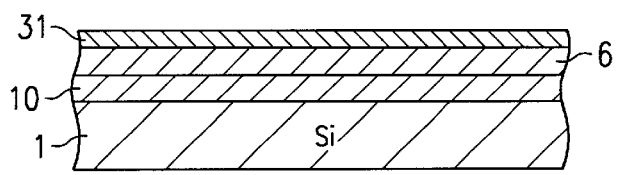
Figure 1D:
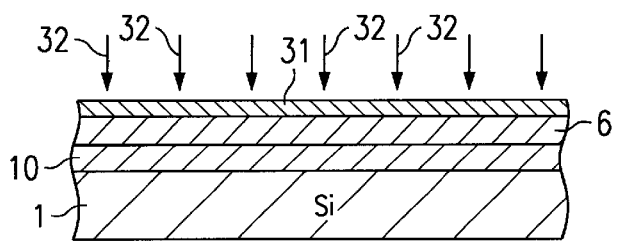
Figure 1E:
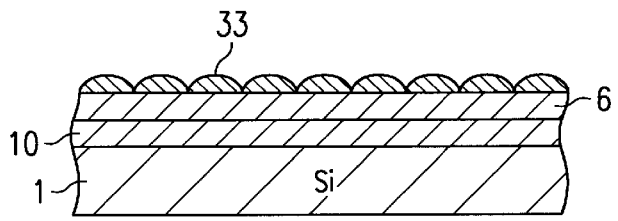
Figure 1F:
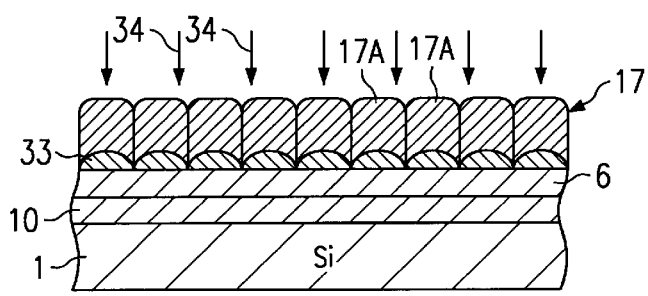
Figure 2A:
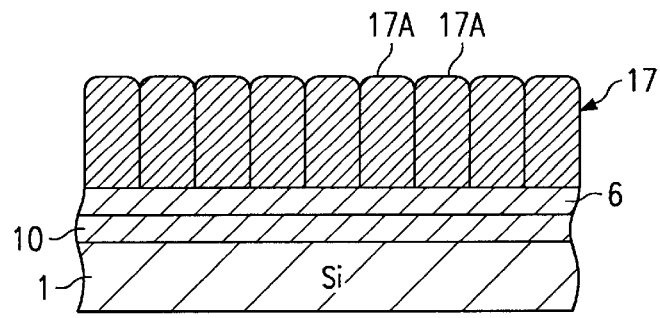
FIG. 2
Figure 2B:
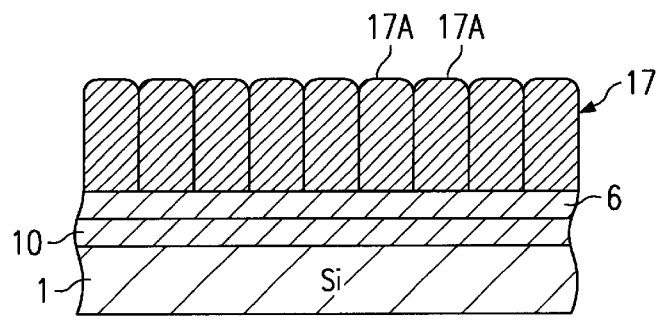
Figure 2C:
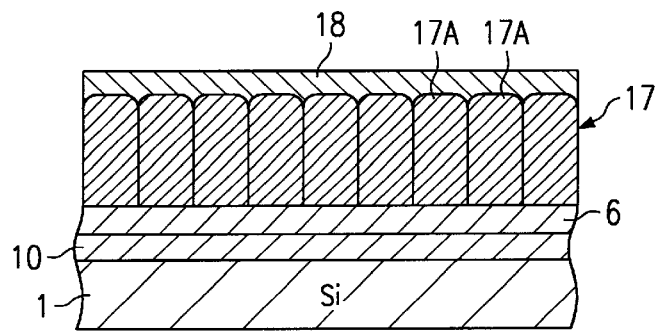
Figure 2D:
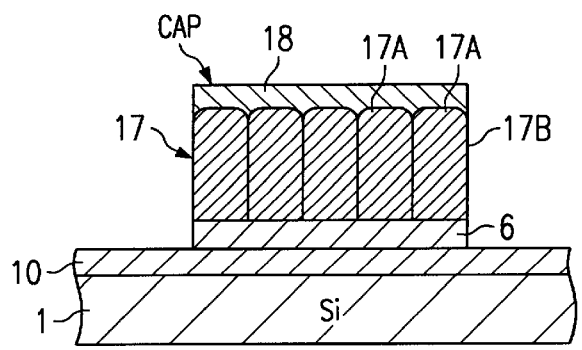

EXPLANATION OF SYMBOLS 1 is a silicon substrate, 3 is a N+ type source region, 4 is a N+ type drain region, 6 and 18 are Ir electrodes, 10 is a SiO2 film, 17 is a ferroelectric film (PZT film), 17A are grains (with a cylindrical structure), 20 is a barrier layer, 30 is a polysilicon [sic; polycrystalline silicon] layer, 31 is a Ti layer, 32 is PbO, 33 is PbTiO3, 34 is Pb(Ti, Zr)O3, CAP is ferroelectric capacitor, TR is transfer gate, M-CEL is memory cell, WL is word line (gate electrode), BL is bit line.

DESCRIPTION OF EMBODIMENTS

In the methods disclosed in this invention for manufacturing the ferroelectric capacitor and ferroelectric memory, it is preferred to deposit the aforementioned metal or metal oxide film (such as the aforementioned titanium film), the aforementioned metal oxide (such as the aforementioned lead oxide), and the constitutive material of the aforementioned ferroelectric film (such as the aforementioned lead zirconate titanate) using the sputtering method, chemical vapor deposition method, or vacuum deposition method.

In particular, it is preferred that the manufacturing method of this invention be carried out as follows: after the aforementioned metal or metal oxide film (such as the aforementioned titanium film) is deposited, the aforementioned metal oxide (such as the aforementioned lead oxide) is deposited using the sputtering method a substrate temperature higher than the crystallization temperature of the constitutive material (such as lead titanate) of the aforementioned ferroelectric film; the constitutive material (such as the aforementioned lead zirconate titanate) of the aforementioned ferroelectric film is then deposited using the sputtering method at a substrate temperature higher than the aforementioned substrate temperature; afterwards, a heat treatment of the deposited film is performed.

In the methods disclosed in this invention for manufacturing the ferroelectric capacitor and ferroelectric memory, the aforementioned first electrode (and the second electrode) is made of Ir or some other conductor that is hard to oxidize at room temperature and that can improve the capacitor's polarization fatigue property. The metal or metal oxide film deposited on the aforementioned first electrode using the sputtering method or vacuum deposition method is a thin film, such as a thin titanium film, with a thickness of 0.5–5.0 nm. Also, PbO or some other metal oxide is deposited on this thin film to a thickness of 0.5Å5.0 nm at a substrate temperature of 400° C. or higher using the sputtering method to form an oxide film (such as a PbTiO3 film) used as the crystal nucleus. The constitutive material of the aforementioned ferroelectric film, such as lead zirconate titanate, is deposited on this oxide film at a substrate temperature of 600 Å7000° C. using the sputtering method. A barrier layer made of TiN, etc., is formed below the aforementioned first electrode to prevent diffusion of the constitutive elements of the capacitor.

In the following, this invention will be explained in more detail with reference to application examples.

Figure 3:
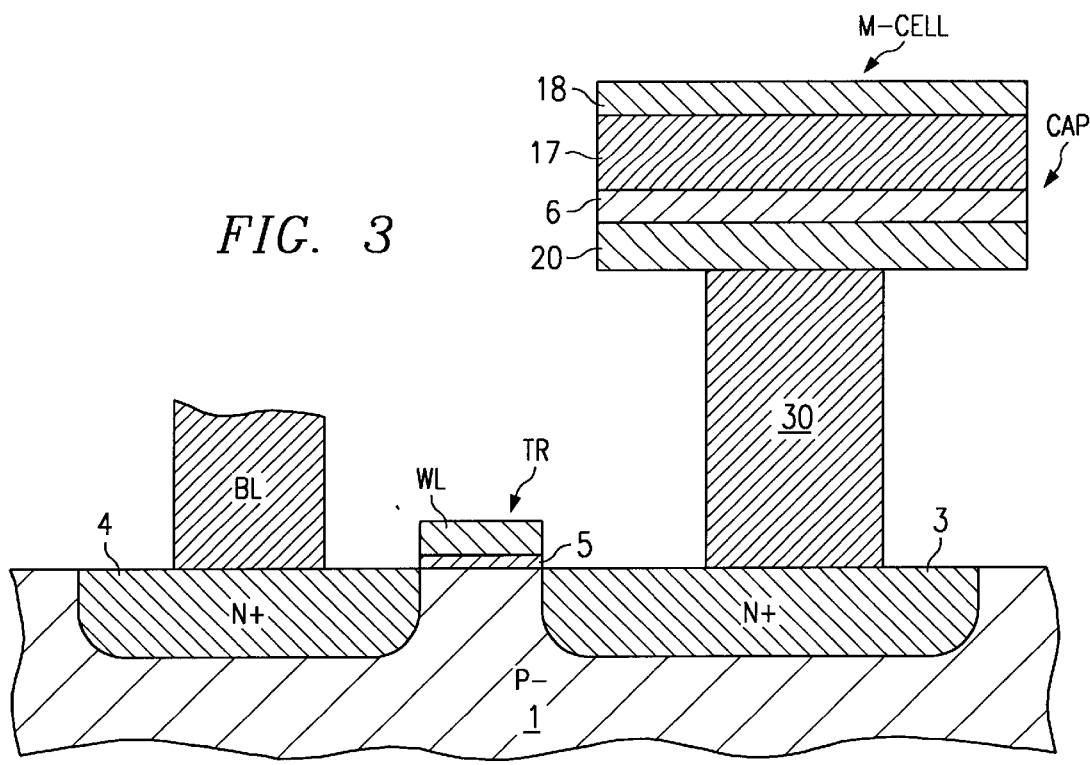
FIG. 3

First, FIG. 3 briefly shows the configuration of ferroelectric capacitor CAP having PZT film 17 formed according to this invention, and shows the configuration of a semiconductor device, such as dynamic RAM memory cell M-CEL (a volatile memory element), in which the ferroelectric capacitor is incorporated. In FIG. 3, the insulating film made of SiO2, etc., is omitted.

In this device, for example, N+ type source region 3 and N+ type drain region 4 are formed on P type silicon substrate 1 by impurity diffusion. Word line WL is set between the aforementioned two regions through gate oxide film 5 to form transfer gate TR. Bit line BL is connected to drain region 4.

Said capacitor CAP is a so-called sputtered capacitor. Source region 3 is connected to polysilicon [sic; polycrystalline silicon] layer 30 embedded in a contact hole formed in the insulating film. The polysilicon [sic, polycrystalline silicon] layer is connected to barrier layer 20 consisting of TiN, TaN, RuO2, etc. The barrier layer is connected to lower electrode 6 made of an Ir layer. Ferroelectric film 17 and upper electrode 18 made of an Ir layer are sequentially laminated on said lower electrode 6. In this structure, PbTiO3 is applied as crystal nucleus on said lower electrode 6 made of an Ir layer using the sputtering method. After PZT is sputtered on PbTiO3, PZT film 17 with a perovskite structure is formed by crystal growth.

In the following, the method for manufacturing ferroelectric capacitor CAP shown in FIG. 3 will be explained with reference to FIGS. 1 and 2. Basically, the ferroelectric capacitor is manufactured as follows. A Ti film with a thickness of about 2 nm is formed by sputtering or deposition on a substrate with a lower electrode made of Ir, etc. At the beginning of the next sputtering step, only PbO is deposited to form PbTiO3 as the initial nucleus on the surface of the substrate. Afterwards, crystalline PZT is deposited.

In step 1, silicon oxide film 10 with a thickness of 200 nm is formed on a Si substrate 1 by thermal oxidation. Said silicon oxide film 10 is an interlayer insulating film. Transfer gate TR, polysilicon [sic; polycrystalline silicon] layer 30, and other constitutive elements of the memory cell shown in FIG. 3 are omitted from FIGS. 1 and 2, which only show the process for forming capacitor CAP.

Subsequently, in step 2, the electron beam heating method or sputtering method is used to form Ir film 6 with a thickness of 100 nm on said silicon oxide film 10 formed in step 1. In this case, as shown in FIG. 3, barrier layer 20 made of TiN, TaN, RuO2, etc. is formed as the substrate layer on polysilicon [sic; polycrystalline silicon] layer 30 in advance.

Subsequently, in step 3, a Ti film 31 with a thickness of 2 nm is deposited on Ir film 6 formed in step 2 at room temperature in vacuum using the electron-beam heating deposition method.

The Ti/Ir/SiO2/Si structure formed in steps 1–3 is used as the substrate.

Figure 4:
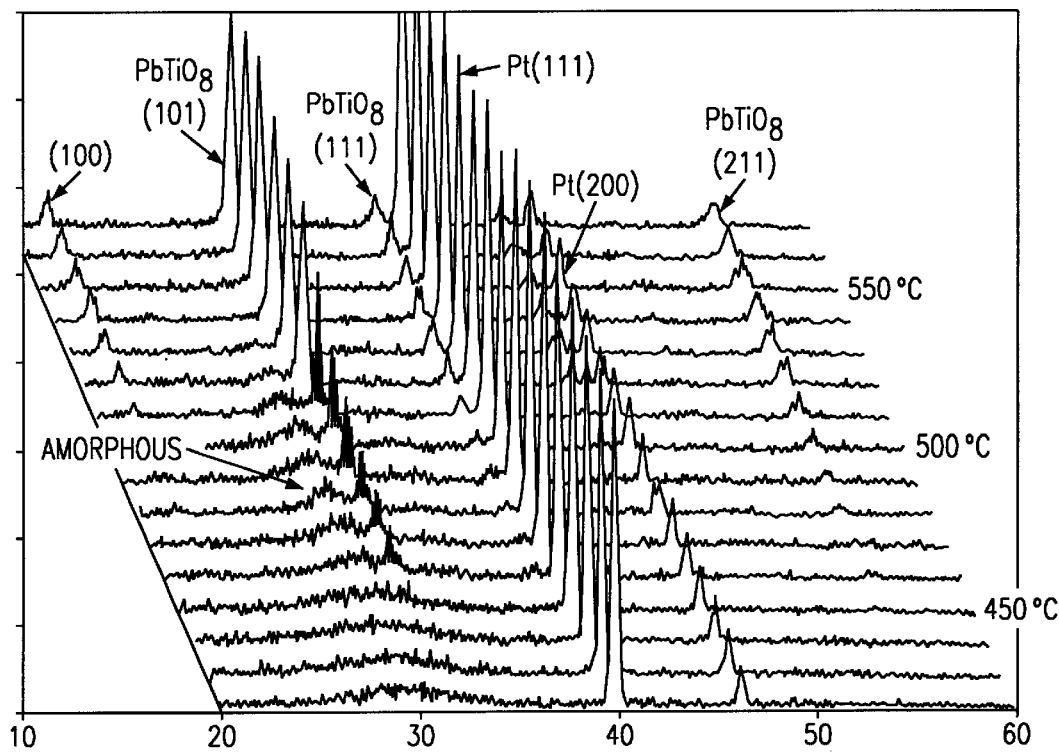
FIG. 4

Subsequently, in step 4, PbO film 32 with a thickness of 2 nm is deposited on Ti film 31 by the sputtering method using a PbO ceramic target or by the reactive sputtering method using a Pb target. The deposition temperature is higher than 460° C. which is the crystallization temperature of PbTiO3. As shown in FIG. 4, the temperature for forming the crystal nucleus made of PbTiO3 is derived from the observation made with the aid of the X-ray diffraction spectrum. It is found from the observation that the formation of PbTiO3 becomes notable when the deposition temperature reaches 460° C. or higher, particularly, 500° C. or higher (although FIG. 4 shows the case in which Pt is used as the electrode material, it is also applicable to Ir). In step 5, PbTiO3 film 33 is then formed as the crystal nucleus on Ir film 6.

Subsequently, in step 6, Pb(Ti, Zr)O3 34 is sputtered by the reactive sputtering method using a Pb(Ti, Zr)O3 target to form Pb(Ti, Zr)O3 film 17 on PbTiO3 33 formed in step 5. The temperature of the substrate is of 600–700° C. in practice. In this step, since PbTiO3 33 formed in steps 4 and 5 becomes the perovskite crystal nucleus, grains (17A) of deposited Pb(Ti, Zr)O3 film 17 grow to a cylindrical shape. In this case, even if the sputtering method is used, PbO does not evaporate from Pb(Ti, Zr)O3. Therefore, the film can be well deposited with the aid of the crystal nucleus on the substrate.

In step 6, PbTiO3 33 reacts with Pb(Ti, Zr)O3 34, then disappears accompanied by the growth of Pb(Ti, Zr)O3 film 17. In step 7, Pb(Ti, Zr)O3 film 17 is formed as a single layer.

Subsequently, in step 8, a heat treatment is performed for Pb(Ti, Zr)O3 film 17 in oxygen at 650° C. for 1 h. The oxygen defects rought about in the sputtering operation are compensated by this eat treatment.

Subsequently in step 9, upper electrode 18 made of, e.g., Ir, is formed using the sputtering method or the electron-beam heating deposition method performed in vacuum.

Subsequently, in step 10, the constitutive layer of the capacitor is patterned by dry etching.

A heat treatment is then performed in oxygen at 500° C. to recover the sputtering meshes on side wall 17B of Pb(Ti, Zr)O3 layer 17.

As explained in the above, according to this application example, in order to form a PZT film with good crystallinity using the sputtering method when manufacturing PZT ferroelectric capacitor CAP, the process of performing Ti deposition PbO deposition Pb(Ti, Zr)O3 deposition on the electrode and the conditions of this process are specified.

After a very thin Ti film 33 is deposited on the surface of electrode 6, PbO 32 is deposited on the Ti film at a substrate temperature higher than the crystallization temperature of PbTiO3. PbTiO3 33 is then formed and used as the crystal nucleus of the perovskite phase for Pb(Ti, Zr)O3 17 to be formed in the next step.

When PZT film 17 is formed by sputtering, PbTiO3 33 has been formed as the crystal nucleus by sputtering PbO on Ti film 31. Therefore, it is possible to deposit and grow PZT on said PbTiO3 in the form of perovskite crystals with a cylindrical structure. Even if electrode 6 is formed using a substance other than Pt, it is still possible to form PZT film 17 with a desired crystal structure on the electrode in a reliable manner. Also, since the sputtering method can be used in this case, a uniform film can be formed without being affected by the surface of the substrate; and the mass production is also improved. When Ir is used for the lower electrode, polarization fatigue occurs with difficulty. Therefore, the fatigue characteristics property is improved.

In the following, electrical characteristics will be compared between the aforementioned PZT film formed on Ir electrode 6 with PbTiO3 film 33 attached and a PZT film formed on an Ir electrode with no crystal nucleus attached.

Figure 5:
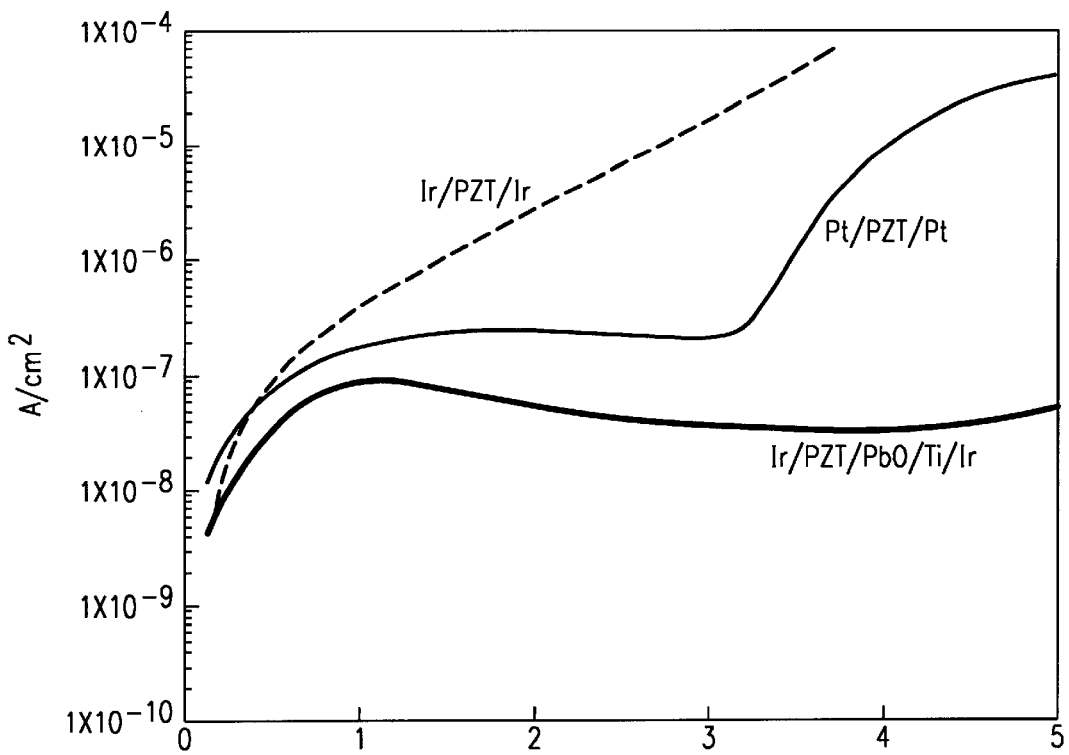
FIG. 5

First, the I–V characteristics curves are shown in FIG. 5. According to the data, it is known that the leakage current value of a PZT film formed on an Ir electrode increases with the increase in the applied voltage. However, the leakage current value of the PZT film formed on the Ir electrode with PbTiO3 attached is almost constant and does not depend on the applied voltage. When 4 V are applied, the leakage current value is $3 \times -10^8$ A/cm2 for the Ir electrode with a crystal nucleus attached and about $1 \times 10 \overset{..}{A} 4$ A/cm2 or higher for the Ir electrode with no crystal nucleus attached. This shows that the IÄV characteristics property can be significantly improved by forming a crystal nucleus on the Ir electrode. In the case of the Pt electrode, the leakage current value is about $1 \times 105$ A/cm2 when a voltage of 4 V is applied, indicating that there is a large leakage current.

Figure 6:
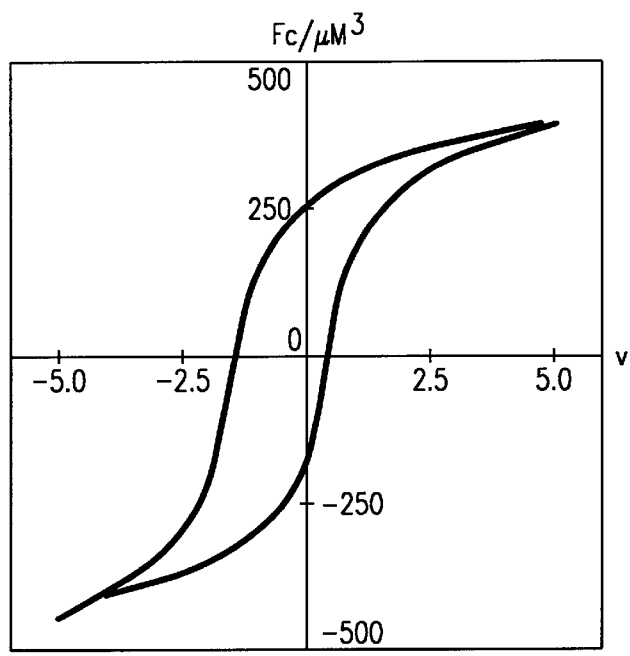
FIG. 6

FIG. 6 shows th e hysteresis curve measured at a maximum voltage of 5 V for the PZT film formed on the Ir electrode with a crystal nucleus attached. As can be seen from the data, an average remnant polarization density of 200 fC/mm2 or higher is obtained. On the other hand, for the PZT film formed on the Ir electrode with no crystal nucleus attached, the polarization characteristics property is deteriorated so much by the leakage current that it cannot be measured.

It is preferred that said capacitor CAP with PbTiO3 film 33 and PZT film 17 formed on Ir electrode 6 be manufactured under the following conditions.

Step Conditions (1) Deposition of Ti 31 Vacuum deposition method or on the substrate sputtering method using Ar Thickness of Ti: 0.5–5.0 nm (or preferably 1.5–2.5 nm); if this film is too thin, the crystal nucleus becomes difficult to form; if this film is too thick, aggregation (segregation) of Ti tends to occur.

Deposition temperature: 200° C. or lower (2) Deposition of PbO 32 Reactive sputtering m ethod using (Ar+O2)

Substrate temperature: 400° C. or higher (higher than the crystallization temperature of PbTiO3) (preferably of 400–500° C.)

Thickness of PbO: 0.5–5.0 nm (preferably 1.5–2.5 nm); if this film is too thin, the crystal nucleus becomes difficult to form; if this film is too thick, aggregation (segregation) tends to occur.

(3) Deposition of Pb(Ti, Zr)O3 17 Reactive sputtering method using (Ar+O2)

Substrate temperature: 600–700° C. (perovskite crystal growth temperature)

Target: Pb(Ti, Zr)O3 or Pb(Ti, Zr)O3 containing La, Nb, Fe, Er, etc., as the additives

* The aforementioned "temperature" means the temperature of the substrate.

Figure 7:
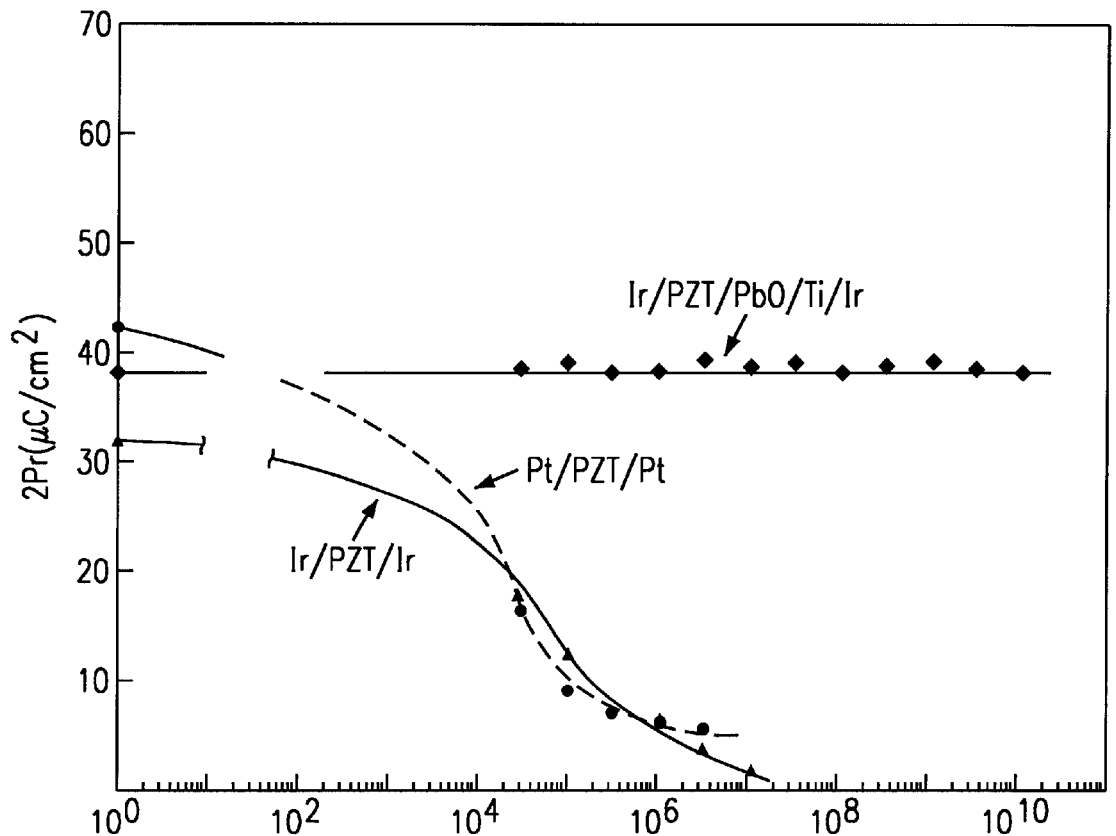
FIG. 7

FIG. 7 shows the polarization fatigue characteristics, curves of the PZT capacitors with the structures of Ir/PZT/PbO/Ti/Ir, Ir/PZT/Ir, and Pt/PZT/Pt.

As can be seen from FIG. 7, for the capacitor with the Pt/PZT/Pt structure using Pt for both the upper and lower electrodes, the polarization characteristics property deteriorates significantly after more than $2 \times 10^5$ times of inversions. Similarly, in the case of the Ir/PZT/Ir structure using Ir for both the upper and lower electrodes but having PZT formed on the Ir electrode using the sputtering method instead of the method disclosed in this invention, the polarization characteristics property deteriorates significantly after more than $2 \times 10^5$ times of inversions. On the other hand, for the capacitor of this application example with the Ir/PZT/PbO/Ti/Ir structure, the polarization characteristics property does not deteriorate even after $2 \times 10^9$ times of inversions.

It is clear that the capacitor of this application example using the Ir electrode with an attached crystal nucleus has a much more stable remnant polarization density (Pr) during polarizing inversion than other capacitors. It is believed that this advantage is due to the high oxidation resistance of the Ir metal.

In the following, the method for manufacturing a semiconductor device, such as a memory cell M-CEL (a stack-type memory cell) of a dynamic RAM (a volatile memory), in which the capacitor obtained in the aforementioned application example is incorporated, will be explained.

Figure 8:
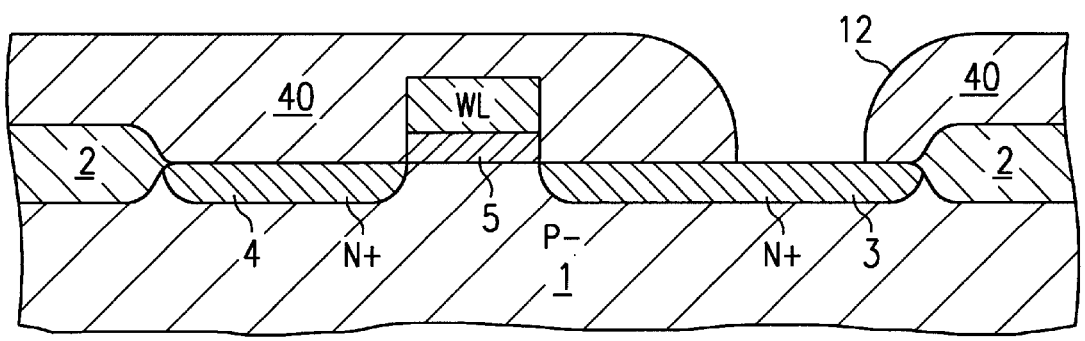
FIG. 8

First, as shown in FIG. 8, field oxide film (2) is formed on P-type silicon substrate (wafer) (1) using the selective oxidation method. Gate oxide film (5) is then formed using the thermal oxidation method; polysilicon [sic; polycrystalline silicon] word line WL is formed using the chemical vapor deposition method. Afterwards, N+ type source region (3) and drain region (4) are formed by thermally diffusing As or some other N type impurity.

Subsequently, contact hole (12) is formed by photolithography on source region (3) in SiO2 insulating layer (40) deposited on the whole surface using the chemical vapor deposition method.

Figure 9:
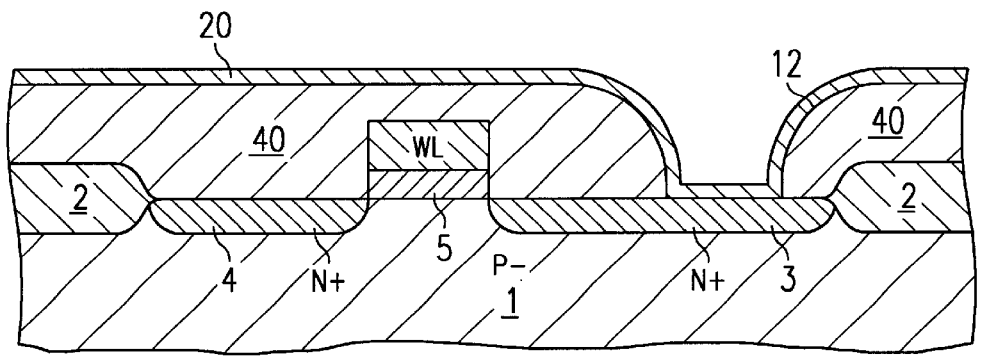
FIG. 9

As shown in FIG. 9, barrier layer (20) made of a thin TiN film is appropriately formed to obtain contact with source region (3) in contact hole (12). It is also possible to embed polysilicon [sic; polycrystalline silicon] in the contact hole below barrier layer (20).

Figure 10:
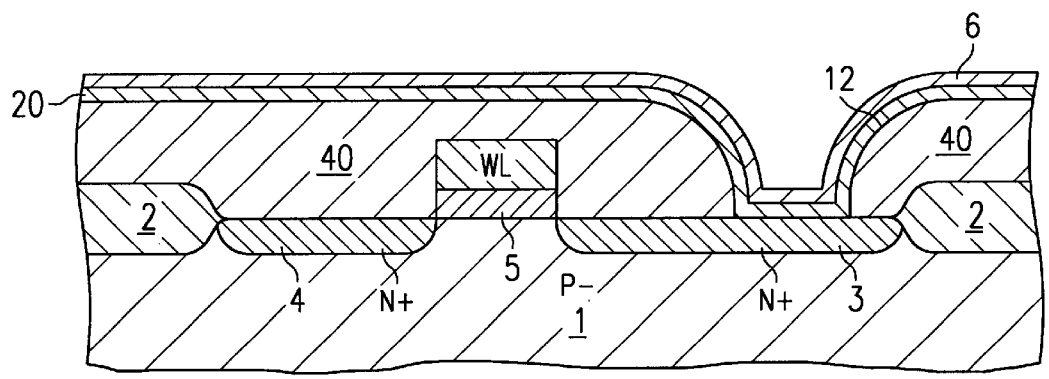
FIG. 10

Subsequently, as shown in FIG. 10, a lower electrode made of Ir layer (6) with a thickness of 100 nm is formed on barrier layer (20) using the sputtering method or the vacuum deposition method.

Figure 11:
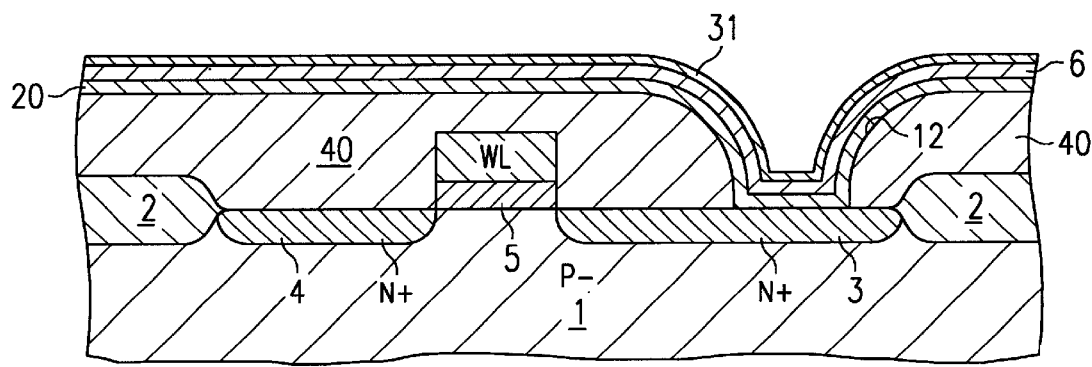
FIG. 11

Afterwards, as shown in FIG. 11, Ti layer (31) with a thickness of 2 nm is deposited using the vacuum deposition method.

Figure 12:
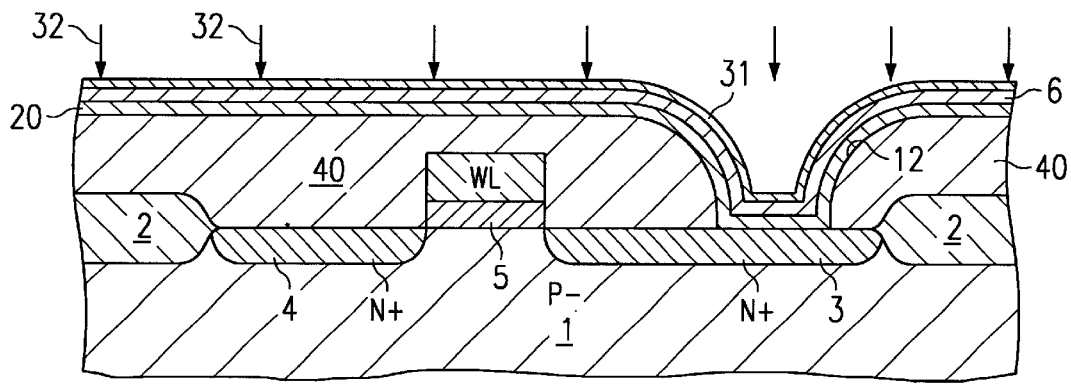
FIG. 12
Figure 13:
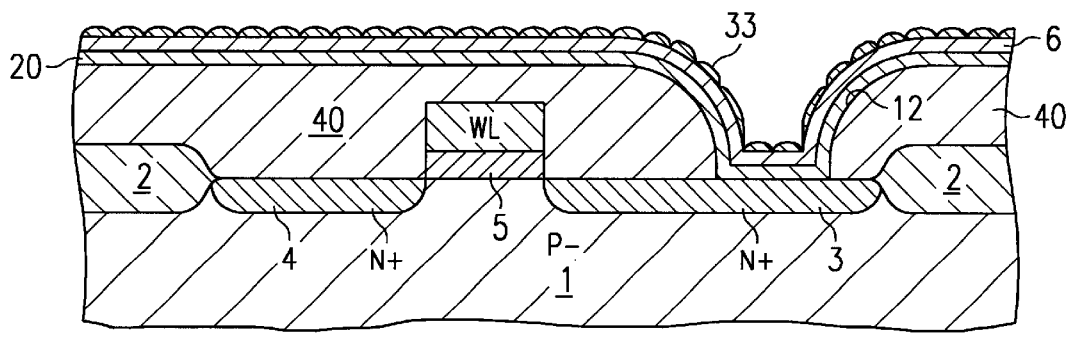
FIG. 13

Subsequently, as shown in FIG. 12, PbO 32 is deposited on Ti layer 31 at a deposition temperature of 460° or higher using the reactive sputtering method. Crystal nuclei making up PbTiO3 layer 33 are then formed as shown in FIG. 13.

Figure 14:
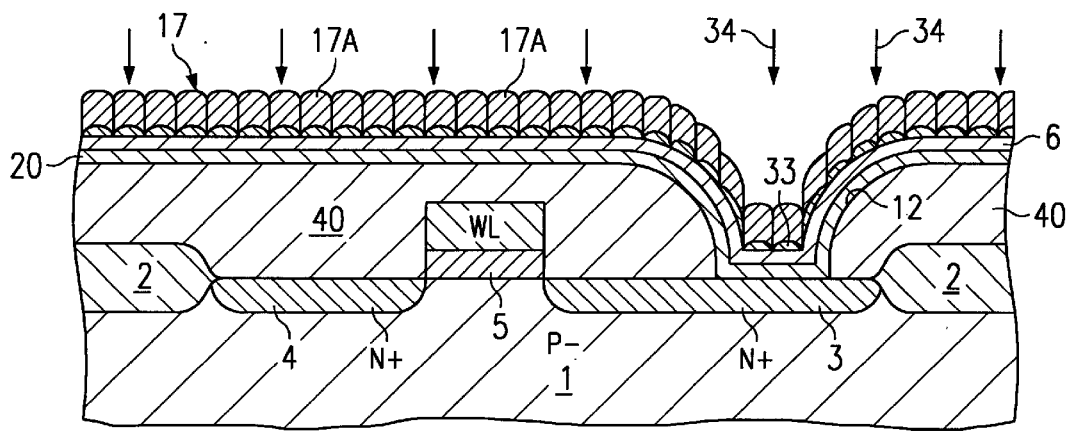
FIG. 14

As shown in FIG. 14, Pb(Ti, Zr)O3 34 is then sputtered on PbTiO333 by the reactive sputtering method using a Pb(Ti, Zr)O3 target to form Pb(Ti, Zr)O3 film 17. The practical temperature of the substrate is 600–700° C. in. Grains 17A of deposited Pb(Ti, Zr)O3 film 17 grow to a cylindrical shape.

Figure 15:
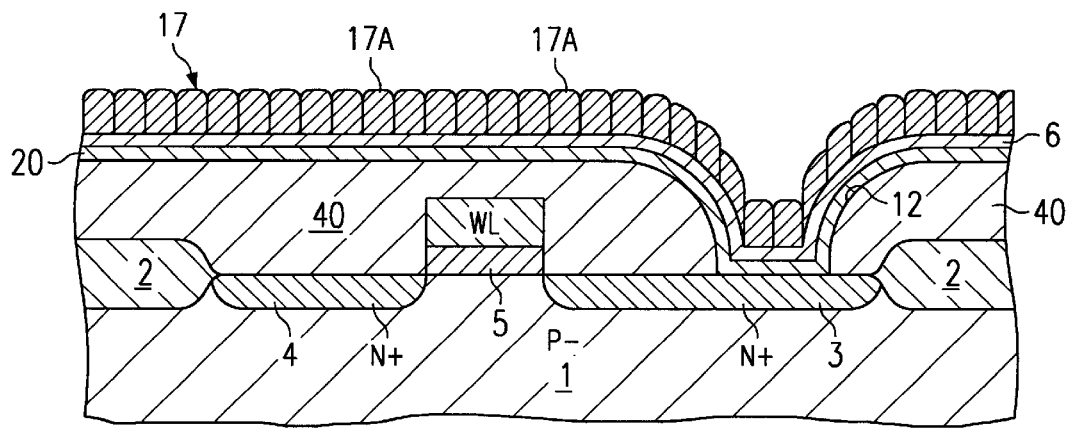
FIG. 15

In this case, PbTiO3 reacts with Pb(Ti, Zr)O3 34, then disappears accompanied by the growth of Pb(Ti, Zr)O3 film 17. As a result Pb(Ti, Zr)O3 film 17 is formed as a single layer as shown in FIG. 15.

A heat treatment of Pb(Ti, Zr)O3 film 17 is performed in oxygen at 650° C. for 1 h. The oxygen defects caused during the sputtering operation are compensated by this heat treatment.

Figure 16:
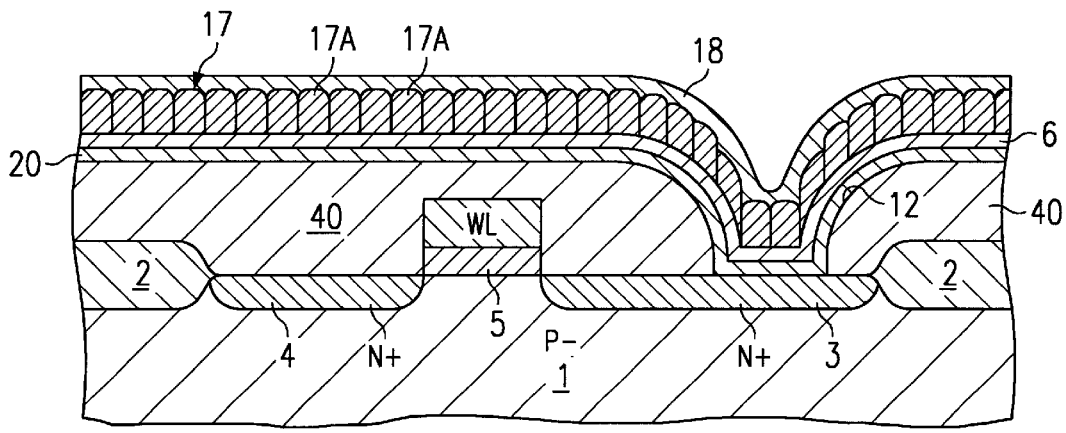
FIG. 16

Subsequently, as shown in FIG. 16, upper electrode 18 made of Ir is formed using the sputtering method or electron-beam heating deposition method performed in vacuum.

Figure 17:
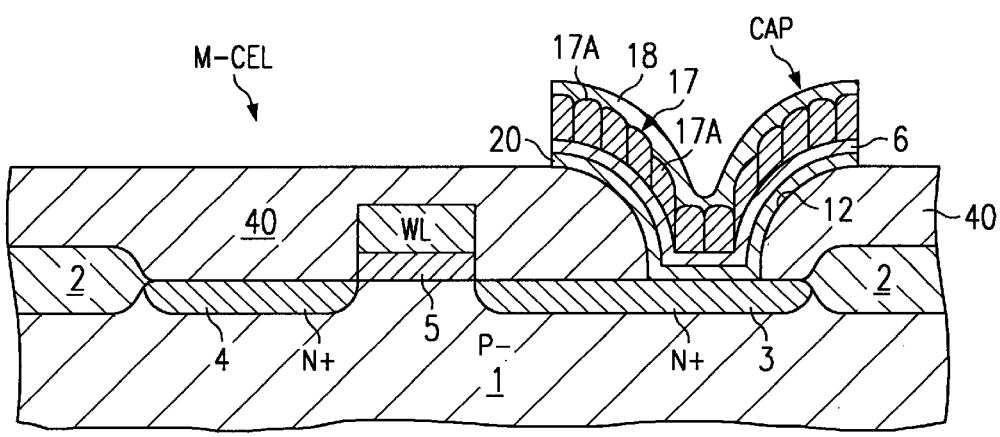
FIG. 17

As shown in FIG. 17, constitutive layers 18, 17, and 6 of the capacitor are then patterned by dry etching.

Afterwards, a heat treatment is performed in oxygen at 500° C. to recover the sputtering damage on side wall 17B of Pb(Ti, Zr)O3 layer 17.

The application examples of this invention have been explained in the above. However, the aforementioned application examples can be modified based on the technical thought of this invention.

For example, any metal or oxide can be used as the electrode material as long as it is able to endure the crystallization temperature of PZT, is hard to oxidize, is a conductor at room temperature, and does not contain Ti. In addition to Ir, it is also possible to use Pt, Pd, Pt—Pd alloy, Cr, Ni, Ni—Cu alloy, Ru, RuO2, TiN, TaN, IrO2, SrRuO3, etc.

In the aforementioned application examples, Ti is used as the nucleus-forming substance deposited on the surface of the electrode. However, it is also possible to use another metal that is easy to oxidize at room temperature. In addition to Ti, it is also possible to deposit one or several types of elements selected from Zr, Pb, Sr, Ba, La, Zn, Nb, and Fe or their oxides on the electrode. For example, when TiOx, metal Pb, or PbO is used in addition to Ti, PbO can be deposited on Ti and TiOx can be deposited on Pb and PbO.

In the aforementioned application examples, the films are formed using the sputtering method. However, it is also possible to form the films using the CVD method or combination of the sputtering method and the CVD method.

Among the aforementioned metals that can be used, La, Zn, Nb, and Fe can be added in the ferroelectric film. Ti, Zr, and Pb are the main components of PZT. Sr and Ba are the main components of BSTO ((Ba, Sr)TiO3).

In the aforementioned application examples, the aforementioned metal or its oxide is deposited using the sputtering method. However, Ti, Zr, Pb, Sr, Ba, La, Zn, Nb, or Fe can also be deposited using the electron-beam heating deposition method performed in a high vacuum environment. It is also possible to naturally oxidize the deposited metal in an oxygen-containing environment (such as in air).

Since Ti is a very active substance, its deposit formed by the electron-beam heating deposition method can be oxidized by the oxygen remaining in the deposition chamber. Consequently, there is no need to perform a strong oxidizing treatment.

Since it can be expected that the effects realized by formation of the nuclei are irrelevant with regard to the thickness of the electrode layer, the thickness of the electrode layer is 5 nm or larger.

The electrode has a structure consisting of a nucleus-forming substance layer/electrode layer/barrier layer. The barrier layer at the bottom of the electrode is coupled with the polysilicon [sic; polycrystalline silicon] layer fit in the contact hole formed in the insulating layer made of a SiO2 layer. An example of the electrode structure of the nucleus-forming substance layer/electrode layer/barrier layer is TiOx/Ir/TiN. Other typical structures obtained from a combination of the aforementioned materials include Ti or TiOx/Ir/TiN, Ti or TiOx/Pt/RuO2, Ti or TiOx/Pt/IrO2, Ti or TiOx/Ni/TiN, Zr or ZrOx/Pt/RuO2, etc. Also, it is not absolutely necessary to form a barrier layer separate from the electrode. In this case, the electrode structure could be Ti or TiOx/IrO2, Ti or TiOx/RuO2, Ti or TiOx/TiN, or Ti or TiOx/ITO (indium tin oxide).

In addition to said PZT, it is also possible to use PZT containing Nb, Zr, or Fe, BSTO ((Ba, Sr)TiO3), PLT ((Pb, La)x(Ti, Zr)1ÅxO3), etc., as the material of the ferroelectric film.

The ferroelectric film of this invention can be used for a device having a capacitor (stack-type capacitor) with the structure of Ir/PZT/Ir/barrier layer/polysilicon [sic; polycrystalline silicon] shown in FIG. 3. However, the use of the ferroelectric film is not limited to the aforementioned device. It can also be used for a device in which the aforementioned stack-type capacitor is set on a SiO2 film, with the lower electrode of the capacitor being extended to be connected with the source region of the transfer gate. It is also possible to use the ferroelectric film for a capacitor that is not the stack type and assembled in a so-called trench (groove).

As described in the above, the manufacturing method of this invention has the following steps:

a step in which at least one type of constitutive metal element (such as titanium) of the ferroelectric film or its oxide is deposited on the first electrode to form a metal or metal oxide film (such as a titanium film);

a step in which the oxide of a metal element (such as the oxide of lead: PbO), which is a type of constitutive metal element of the aforementioned ferroelectric film and is different from the aforementioned metal or metal oxide film, is deposited on the aforementioned metal or metal oxide film;

a step in which an oxide film (such as lead titanate: PbTiO3) consisting of the deposited metal oxide (such as lead oxide) and the metal (such as titanium) of the aforementioned metal or metal oxide film, is generated on the aforementioned first electrode;

a step in which the generated oxide film is used as the crystal nucleus, and the constitutive material (such as lead zirconate titanate: Pb(Ti, Zr)O3) of the aforementioned ferroelectric film is deposited on the oxide film to form the aforementioned ferroelectric film; and a step in which the aforementioned second electrode is formed on the ferroelectric film. Consequently, when the aforementioned ferroelectric film is formed using the sputtering method, the ferroelectric crystals can be deposited and can grow to a desired structure on the aforementioned crystal nuclei. Regardless of the material used for the first electrode, the ferroelectric film with a desired crystal structure can be reliably formed on the first electrode. Also, since the sputtering method can be used, a uniform film can be formed without being affected by the surface of the substrate, and the mass production level can be improved. When Ir is used for the aforementioned first and second electrodes, polarization fatigue occurs with difficulty. Therefore, the fatigue characteristics property is improved.

What is claimed is:

1. A method for manufacturing a ferroelectric capacitor comprising a first electrode made of iridium, a lead zirconate titanate ferroelectric film on the first electrode, and a second electrode made of iridium on the ferroelectric film; the manufacturing method having the following steps:

a) depositing titanium, a constitutive metal element of the ferroelectric film, on the first electrode to form a titanium film;

b) depositing an oxide of lead, a constitutive metal element of the ferroelectric film, on the titanium film;

c) forming a lead titanate film including of the deposited lead oxide and titanium of the titanium film on the first electrode;

d) depositing a constitutive material of the lead zirconate titanate ferroelectric film on the formed lead titanate film used as the crystal nucleus to form the ferroelectric film; and e) forming the second electrode on the ferroelectric film;

wherein after the titanium film is deposited using the sputtering method, chemical vapor deposition method, or vacuum deposition method, the lead oxide is deposited using the sputtering method at a substrate temperature higher than the crystallization temperature of the lead titanate film; then with the constitutive material of the lead zirconate titanate ferroelectric film being deposited using the sputtering method at a substrate temperature higher than the perovskite crystal growth temperature; and afterwards with, a heat treatment of the deposited film being performed.

2. The method of claim 1 wherein the first electrode is a bottom electrode of said capacitor.

3. A method for manufacturing a ferroelectric capacitor comprising a first electrode made of iridium, a lead zirconate titanate ferroelectric film on the first electrode, and a second electrode made of iridium on the ferroelectric film; the manufacturing method having the following steps:

a) depositing titanium, a constitutive metal element of the ferroelectric film, on the first electrode to form a titanium film;

b) depositing an oxide of lead, a constitutive metal element of the ferroelectric film, on the titanium film;

c) forming a lead titanate film including the deposited lead oxide and titanium of the titanium film on the first electrode;

d) depositing a constitutive material of the lead zirconate titanate ferroelectric film on the formed lead titanate film used as the crystal nucleus to form the ferroelectric film, and e) forming the second electrode on the ferroelectric film;

wherein after the titanium film is deposited using the sputtering method, chemical vapor deposition method, or vacuum deposition method, the lead oxide is deposited at a substrate temperature higher than the crystallization temperature of the lead titanate film; then the constitutive material of the lead zirconate titanate ferroelectric film is deposited at a substrate temperature higher than theperovskite crystal growth temperature; and afterwards, a heat treatment of the deposited film being performed.

* * * * *

UNITED STATES PATENT AND TRADEMARK OFFICE
CERTIFICATE OF CORRECTION

PATENT NO.    : 6,297,085 B1
DATED         : October 2, 2001
INVENTOR(S)   : Katsuhiro Aoki, Yukio Fukuda, Ikuko Murayama, Ken Numata and
                Akitoshi Nishimura It is certified that error appears in the above-identified patent and that said Letters Patent is hereby corrected as shown below:

<u>Title page,</u>
Item [30], Foreign Application Priority Data, please insert -- Application No. 8 (1996)351916 filed on December 11, 1996 in Japan --

Signed and Sealed this

Thirtieth Day of July, 2002

*Attest:*

*Attesting Officer*

JAMES E. ROGAN
*Director of the United States Patent and Trademark Office*